US010177021B2

(12) United States Patent
Ho et al.

(10) Patent No.: US 10,177,021 B2
(45) Date of Patent: Jan. 8, 2019

(54) INTEGRATED CIRCUITS AND METHODS THEREFOR

(71) Applicant: NXP B.V., Eindhoven (NL)

(72) Inventors: Chung Hsiung Ho, Kaohsiung (TW); Wen-Hsuan Lin, Kaohsiung (TW); Ju-Hsuan Ko, Kaohsiung (TW); Chih Hung Chang, Donggang (TW)

(73) Assignee: NXP B.V., Eindhoven (NL)

( * ) Notice: Subject to any disclaimer, the term of this patent is extended or adjusted under 35 U.S.C. 154(b) by 151 days.

(21) Appl. No.: 14/994,810

(22) Filed: Jan. 13, 2016

(65) Prior Publication Data

US 2017/0200657 A1 Jul. 13, 2017

(51) Int. Cl.
| | |
|---|---|
| *G01R 1/04* | (2006.01) |
| *G01R 31/28* | (2006.01) |
| *H01L 21/683* | (2006.01) |
| *H01L 21/56* | (2006.01) |
| *H01L 21/78* | (2006.01) |
| *H01L 23/544* | (2006.01) |

(52) U.S. Cl.
CPC ........ *H01L 21/6835* (2013.01); *G01R 1/0491* (2013.01); *G01R 31/2867* (2013.01); *G01R 31/2875* (2013.01); *H01L 21/561* (2013.01); *H01L 21/78* (2013.01); *H01L 23/544* (2013.01); *H01L 2221/68327* (2013.01)

(58) Field of Classification Search
CPC ............ G01R 31/2865; G01R 31/2875; G01R 31/2891; H01L 22/14; H01L 21/561; H01L 21/6835; H01L 21/78; H01L 23/544; H01L 2221/68327
See application file for complete search history.

(56) References Cited

U.S. PATENT DOCUMENTS

| | | | | |
|---|---|---|---|---|
| 5,555,422 A | * | 9/1996 | Nakano .............. | G01R 1/07307 324/750.25 |
| 5,903,163 A | * | 5/1999 | Tverdy .............. | G01R 31/2849 324/750.08 |
| 7,688,063 B2 | * | 3/2010 | McFarland .............. | G01R 1/44 324/750.03 |

(Continued)

OTHER PUBLICATIONS

FreeScale, Wafer Level Chip Scale Package (WLCSP), FreeScale Semiconductor, Inc. Rev. 4.0, Aug. 2015.*

(Continued)

*Primary Examiner* — Jermelle M Hollington
*Assistant Examiner* — Sean Curtis

(57) ABSTRACT

Aspects of the present disclosure are directed to methods and apparatuses involving a chip carrier having openings therein that align integrated circuit (IC) chips relative to an alignment feature. The IC chips and carrier are tested, such as by final testing the affixed IC chips after manufacture, and further testing after subjecting the affixed IC chips to one or more stress conditions. A test probe is aligned to one or more contacts on each chip based on the location of an alignment feature of the carrier relative to the opening in which the IC chip being tested is located. Responsiveness of the IC chip, before and after application of the one or more stress conditions, can be assessed by probing the IC chip via the aligned test probe, and assessing electrical signals received over the test probe.

20 Claims, 7 Drawing Sheets

(56) References Cited

U.S. PATENT DOCUMENTS

| | | | | |
|---|---|---|---|---|
| 7,876,087 | B2* | 1/2011 | Mok | C23C 26/00 324/750.3 |
| 9,110,129 | B1* | 8/2015 | Ames | G01R 31/2808 |
| 9,196,537 | B2 | 11/2015 | Van Gemert et al. | |
| 9,341,671 | B2* | 5/2016 | Wang | G01R 31/318513 |
| 9,640,498 | B1* | 5/2017 | Huang | H01L 21/568 |
| 2003/0038365 | A1* | 2/2003 | Farnworth | H01L 23/544 257/723 |
| 2003/0046810 | A1* | 3/2003 | Farnworth | H01L 23/544 29/740 |
| 2008/0038098 | A1* | 2/2008 | Ito | G01R 31/31718 414/222.01 |
| 2008/0061808 | A1* | 3/2008 | Mok | C23C 26/00 324/754.14 |
| 2008/0079456 | A1* | 4/2008 | Lee | G01R 31/2893 324/750.03 |
| 2009/0130821 | A1* | 5/2009 | Cox | H01L 23/544 438/455 |
| 2009/0195264 | A1* | 8/2009 | Tsen | G01R 31/2867 324/750.03 |
| 2009/0206860 | A1* | 8/2009 | McFarland | G01R 1/44 324/750.03 |
| 2011/0012631 | A1* | 1/2011 | Merrow | G11B 33/128 324/750.03 |
| 2011/0074458 | A1* | 3/2011 | Di Stefano | G01R 1/0466 324/757.01 |
| 2012/0139572 | A1* | 6/2012 | Kim | G01R 31/2889 324/754.07 |
| 2012/0249177 | A1* | 10/2012 | Choi | G01R 31/2893 324/756.02 |
| 2013/0057310 | A1* | 3/2013 | Hasegawa | H01L 24/75 324/757.01 |
| 2013/0200916 | A1* | 8/2013 | Panagas | G01R 1/0441 324/757.01 |
| 2014/0015559 | A1* | 1/2014 | Lee | G01R 1/0466 324/756.02 |
| 2014/0110842 | A1 | 4/2014 | Nenz et al. | |
| 2014/0145294 | A1 | 5/2014 | Moeller et al. | |
| 2014/0306728 | A1* | 10/2014 | Arena | G01R 31/2808 324/750.08 |
| 2014/0331782 | A1* | 11/2014 | Keranen | G01N 3/54 73/856 |
| 2015/0061718 | A1* | 3/2015 | Chan | G01R 31/2886 324/750.03 |
| 2015/0233967 | A1* | 8/2015 | Thordarson | G11C 29/56016 324/750.14 |
| 2015/0234006 | A1* | 8/2015 | Richards | G01R 31/308 324/756.02 |
| 2015/0303171 | A1 | 10/2015 | Patten et al. | |
| 2015/0355231 | A1* | 12/2015 | Rogel-Favila | G01R 31/26 324/750.13 |
| 2015/0355268 | A1* | 12/2015 | Rogel-Favila | G01R 31/2893 324/750.08 |
| 2015/0355270 | A1* | 12/2015 | Rogel-Favila | G01R 31/2874 324/750.08 |
| 2015/0355271 | A1* | 12/2015 | Rogel-Favila | G01R 31/2867 324/750.08 |
| 2015/0355279 | A1* | 12/2015 | Rogel-Favila | G01R 31/2893 324/750.25 |
| 2017/0018450 | A1* | 1/2017 | Tang | B05D 1/005 |
| 2017/0110425 | A1* | 4/2017 | Huang | H01L 24/19 |
| 2017/0200657 | A1* | 7/2017 | Ho | G01R 31/2875 |

OTHER PUBLICATIONS

Kirschman, Randall, Tutorial—Part I—based on Extreme-Temperature Electronics Newsletter Issue #1 (Apr. 26, 2001). Last updated Jan. 2012.*

Lee, Joon Y., Thermally Conductive Adhesive Tapes, http://electroiq.com, May 2007.*

Morishima et al., Development of Anti-Static UV-tapes for Semiconductor Processing, Furukawa Review, No. 22, Copyright 2002.*

* cited by examiner

INTEGRATED CIRCUITS AND METHODS THEREFOR

OVERVIEW

Aspects of the present disclosure relate to apparatuses, devices, and methods involving integrated circuits, their manufacture and testing.

Integrated Circuit (IC) chips (which can be referred to as dies) are often produced by forming a plurality of individual ICs within a semiconductor substrate, such as a silicon wafer. The ICs are then separated from one another, such as by sawing/cutting through the silicon wafer and between the ICs, and perhaps removing a portion of the wafer, to form individual IC chips. In this context, the IC chips are formed in the wafer and then separated from one another, in a process that may be referred to as dicing. Sawing may be performed using various mechanical cutting and laser cutting methods.

For certain applications, testing the IC chips can be challenging, particularly when the IC chips are made to increasingly smaller scales. Handling small chips, and particularly thin chips, can cause damage. Further, where testing IC chips under various conditions is desirable, such testing can require additional handling which, again, subjects the IC chips to further chances of damage.

For many applications, it is desirable to incorporate a large number of electronic devices in a single silicon wafer. One such application involves molding a wafer level chip scale package (WLCSP) that can save valuable space, which is particularly useful for mobile devices such as phones, computers, media players, and hand-held controllers. However, as the number of electronic devices per given area of the silicon wafer increases, the manufacturing process becomes more difficult, particularly in relation to the above issues.

These and other issues present challenges to IC chips, their manufacture and related testing.

SUMMARY

Aspects of the present disclosure relate to IC chips prepared from a silicon wafer. In an embodiment, a method involves one or more aspects as follows. A plurality of integrated circuit (IC) chips are aligned relative to an alignment feature of a chip carrier having a rigid structure with openings therein, by placing the IC chips within the openings of the chip carrier. The IC chips are affixed in the openings and relative to the alignment feature, and are subjected to one or more stress conditions while affixed in the openings. The operation of each of the IC chips is tested by coupling a test probe to a contact on the IC chip, by aligning the test probe to the contact based on the location of the alignment feature relative to the opening in which the IC chip is located. Responsiveness of the IC chip to the one or more stress conditions is assessed by probing the IC chip via the aligned test probe, and assessing electrical signals received over the test probe.

Another embodiment is directed to an apparatus including a chip carrier and testing circuitry. The chip carrier is adhered to an adhesive substrate, and has a rigid structure with openings therein and an alignment feature in the rigid structure. The chip carrier and adhesive substrate align a plurality of integrated circuit (IC) chips relative to the alignment feature via the openings of the chip carrier, and adhere the IC chips to the adhesive substrate via which the IC chips are affixed in the openings and relative to the alignment feature. The chip carrier is also operable to hold the IC chips in the openings while the IC chips are subjected to one or more stress conditions (e.g., heat). The testing circuitry includes a test probe and operates with the chip carrier to test operation of each IC chip as follows. The test probe is coupled to a contact on the IC chip by aligning the test probe to the contact based on the location of the alignment feature relative to the opening in which the IC chip is located. Responsiveness of the IC chip to the one or more stress conditions is assessed by probing the IC chip via the aligned test probe, and assessing electrical signals received over the test probe.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

BRIEF DESCRIPTION OF FIGURES

Aspects of the present disclosure may be more completely understood in consideration of the detailed description of various embodiments of the present disclosure that follows in connection with the accompanying drawings, in which.

Figure 1:
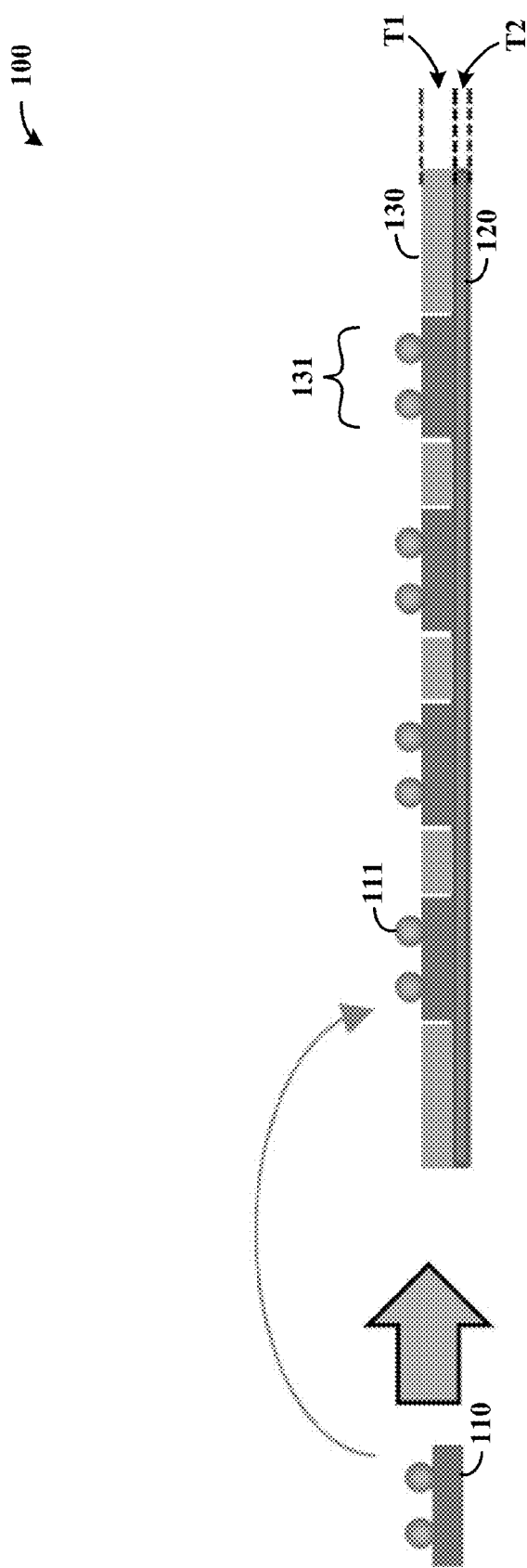
FIG. 1 shows a chip carrier with IC chips aligned therein, in accordance with one or more embodiments.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving IC chips formed from a semiconductor wafer, their manufacture and/or testing. In certain implementations, aspects of the present disclosure have been shown to be beneficial when used in the context of iteratively testing IC chips and subjecting them to stress, such as thermal or mechanical stress, which can be carried out at different testing stations and over time. The chip carrier and adhesive substrate affix IC chips for alignment within the chip carrier, and therein facilitate testing of the IC chips under various conditions while the IC chips are mounted in the chip carrier. This permits accurate testing while protecting the IC chips and providing for aligned (e.g., automated) access thereto, which can be repeated accurately. These and other aspects can be implemented to address challenges, including those discussed in the background above. While not necessarily so limited, various aspects may be appreciated through a discussion of examples using such exemplary contexts.

Various embodiments are directed to methods involving one or more aspects as follows. A plurality of integrated circuit (IC) chips are aligned relative to an alignment feature of a chip carrier having a rigid structure with openings therein, by placing the IC chips within the openings of the chip carrier. The IC chips are affixed in the openings and relative to the alignment feature, and are subjected to one or more stress conditions while affixed in the openings. The operation of each of the IC chips is tested by coupling a test probe to a contact on the IC chip, by aligning the test probe to the contact based on the location of the alignment feature relative to the opening in which the IC chip is located. Responsiveness or other performance of the IC chip to the stress condition(s) can be assessed by probing the IC chip via the aligned test probe, and obtaining electrical signals over the test probe which can be assessed.

In these and other contexts such testing may, for example, be carried out as a final test after manufacturing (e.g., before any stress application or testing) and after stress testing. Use of the carrier provides the ability to move the IC chips between different test stations while maintaining their alignment and therein facilitating testing. Such an approach can thus be implemented with automated test approaches in which probes are aligned to test contacts on the IC chips, and further with approaches involving different test stations, or moving the carrier between a reliability stress application (e.g., a heated chamber or moisture chamber) and a test station. For instance, the test probe can be respectively coupled to one or more of the IC chips as part of a final test carried out at the end of a manufacturing sequence, and again to one or more of the IC chips for reliability testing after subjecting the IC chips to a stress condition or conditions. These tests can be carried out while the IC chips are affixed in the openings.

A variety of stress conditions can be applied to the IC chips to suit particular applications. Such conditions may include one or more of high temperatures, low temperatures, temperature cycling, accelerated environmental testing, mechanical bending, and storage life testing. For instance, the IC chips, chip carrier and adhesive substrate can all be heated to a temperature of at least 200° C. Higher temperature testing can be carried out at temperatures of about 260° C. for 5 minutes, which can be repeated, and which may represent process conditions such as those relating to infrared (IR) reflow processes. Low temperature storage life tests can be carried out at about −44° C. for 10 minutes, and can also be repeated. Temperature cycling may involve cycling the IC chips between about −65° C. to 150° C. (e.g., for 200, 500, or 1000 cycles). Accelerated environmental testing can be carried out at 130° C. and 85% RH (relative humidity), for a predetermined time (e.g., 192 h). Storage life testing may be carried out at an elevated temperature such as 175° C., for a period of time such as 200 hours.

The IC chips may be affixed by, for example, adhering the chip carrier and the IC chips to an adhesive substrate, such as a tape or strip of material with adhesive thereupon. In some implementations, the chip carrier and the IC chips are provided at about equal thickness, which facilitates affixing the IC chips while maintaining a low profile of the chip carrier. The adhesive substrate may be implemented with a thickness of no more than about half the thickness of the chip carrier. In some implementations, the IC chips and the chip carrier are adhered to the adhesive substrate, after aligning the IC chips (e.g., with the chips being set in place and adhesive tape applied thereafter).

Various embodiments involve testing IC chips as may be provided, and other embodiments involve forming the IC chips in a semiconductor wafer. For the latter, the IC chips are separated (e.g., along saw lanes) in the semiconductor wafer, between adjacent ones of the IC chips while holding the IC chips in place relative to one another. This can be carried out by forming saw lanes that extend through the IC chips into a portion of the wafer underneath; the wafer can later be thinned to at point at which the IC chips are separated. The IC chips are encapsulated to form a wafer level chip scale package (WLCSP), each of which is affixed in one of the chip carrier openings.

Aligning is carried out in a variety of manners. In some embodiments, each opening in the chip carrier has an inner perimeter that aligns with an outer perimeter of one of the IC chips placed therein. As such, the inner perimeter of the openings is used to align the IC chips within the openings. Tolerances can be set accordingly to fit particular applications. In this context, a gap between the inner and outer perimeter can be set sufficiently small to facilitate the coupling of the test probe to the contact on the chip based on the location of the alignment feature. For instance, where a chip has a test probe contact of a certain area, that contact can be affixed relative to an alignment mark or mechanical feature used to direct a probe to the test probe contact and within a position tolerance that allows automated placement of the probe within the certain area. For certain WLCSPs, such a tolerance may be effected, for example, at about 80 micrometers.

Various embodiments are directed to making and/or using chip carriers that facilitate handling of the IC chips without damage thereto. This may be facilitated using tolerances as characterized above, and by further features. In some embodiments, the chip carrier is provided with openings of a square or rectangular shape, with a relief in one or more corners. This relief may involve the creation of a drilled or otherwise extended corner, such that tolerances along sides of the IC chips can be maintained low for alignment while providing an increased spacing between the corners of the IC chips and the carrier. In this context, it has been discovered that small/tight tolerances can be used for accurate placement of fragile IC chips, while maintaining protection to the corners thereof.

Chip carriers as characterized herein may be aligned and/or used to align IC chips in a variety of manners. In some embodiments, an alignment feature on the chip carrier is coupled or aligned to a test platform, which fixes the chip carrier and plurality of IC chips relative to the test platform (and, e.g., a test probe operated with the test platform). Such an alignment feature may include, for example, a recess or slot that may fit onto a mechanical feature of the platform, or a protrusion that may protrude into a corresponding recess or slot in the platform. In certain embodiments, the alignment feature includes a mechanical component that can be coupled to a test platform, such as noted above and/or another coupling or clamping component. The mechanical component can be implemented to secure the chip carrier to the test platform and hold the plurality of ICs in place for access by the test probe, such as by clamping. In some embodiments, a test platform having a recess is used to accept and hold the chip carrier in place. The recess may be provided with a shape that mimics a perimeter of the chip carrier, with a relatively low tolerance gap therebetween.

Other embodiments are directed to an apparatus including a chip carrier and testing circuitry. The chip carrier is adhered to an adhesive substrate, and has a rigid structure with openings therein and an alignment feature in the rigid structure. The chip carrier and adhesive substrate align a plurality of integrated circuit (IC) chips relative to the alignment feature via the openings of the chip carrier, and adhere the IC chips to the adhesive substrate via which the IC chips are affixed in the openings and relative to the alignment feature. The chip carrier is also operable to hold the IC chips in the openings while the IC chips are subjected to one or more stress conditions (e.g., heat). The testing circuitry includes a test probe and operates with the chip carrier to test operation of each IC chip as follows. The test probe is coupled to a contact on the IC chip by aligning the test probe to the contact based on the location of the alignment feature relative to the opening in which the IC chip is located. Responsiveness of the IC chip to the one or more stress conditions is assessed by probing the IC chip via the aligned test probe, and assessing electrical signals received over the test probe.

The apparatus can be implemented using a variety of approaches, including those characterized above. For instance, the openings in the chip carrier may be provided or formed with an inner perimeter that aligns with an outer perimeter of the IC chips, with a gap having a tolerance that facilitates alignment. In this context, the inner perimeter aligns the IC chips within the openings, and the gap can be made sufficiently small to facilitate the coupling of the test probe to the contact on the chip based on the location of the alignment feature, contact size and/or other conditions. Further, the chip carrier may include a relief in one or more corners thereof, which helps to mitigate damage to chip corners.

The testing circuitry can be implemented in a variety of manners. For instance, a probe can be positioned automatically relative to a test platen, to which a chip carrier is coupled with IC chips affixed therein. Testing can be carried out prior to subjecting the IC chips to stress conditions, such as in a test station at the end of a manufacturing process. After this, the carrier may be moved to a stress testing chamber, and returned after stress testing to the test station. The probe can be re-aligned, using the chip carrier alignment, to respective test contacts on each chip and used to analyze operation of the IC chips after the stress testing. This approach can provide for an assessment of operation of the IC chips before and after subjecting the IC chips to stress.

In various embodiments, the apparatus as noted above also includes a test platform, with the alignment feature being a mechanical component that mechanically couples to the test platform. The testing circuitry operates with the test platform to test the operation of each of the plurality of chips, by using the mechanical component to mechanically secure the chip carrier to the test platform and hold the plurality of ICs in place for access by the test probe. The mechanical component can be implemented in a variety of manners, such as those noted above, with a recess in the test platform having an inner perimeter that operates with an outer perimeter of the chip carrier to hold the chip carrier in place and in a fixed orientation. The testing circuitry can then align the test probe to the contact on each chip based on a location of the recess.

Turning now to the figures, FIG. 1 shows a chip carrier apparatus 100 with IC chips (including 110) aligned therein, in accordance with one or more embodiments. The chip carrier apparatus 100 includes a chip carrier 130 having openings therein, with opening 131 labeled by way of example. IC chips such as IC chip 110 are placed in each of the openings, and affixed relative to the chip carrier 130 by an adhesive material 120. The thickness of the respective carrier 130 and adhesive material 120, depicted at T1 and T2, can be set accordingly (e.g., with T2 being half or less of the thickness of T1). Exposed contacts of the IC chips, including contact 111 labeled by way of example, can be used to probe each IC chip for testing thereof. For instance, the apparatus 100 can be moved between test stations and stress testing componentry for iteratively testing, stressing and testing the IC chips.

Figure 2A:
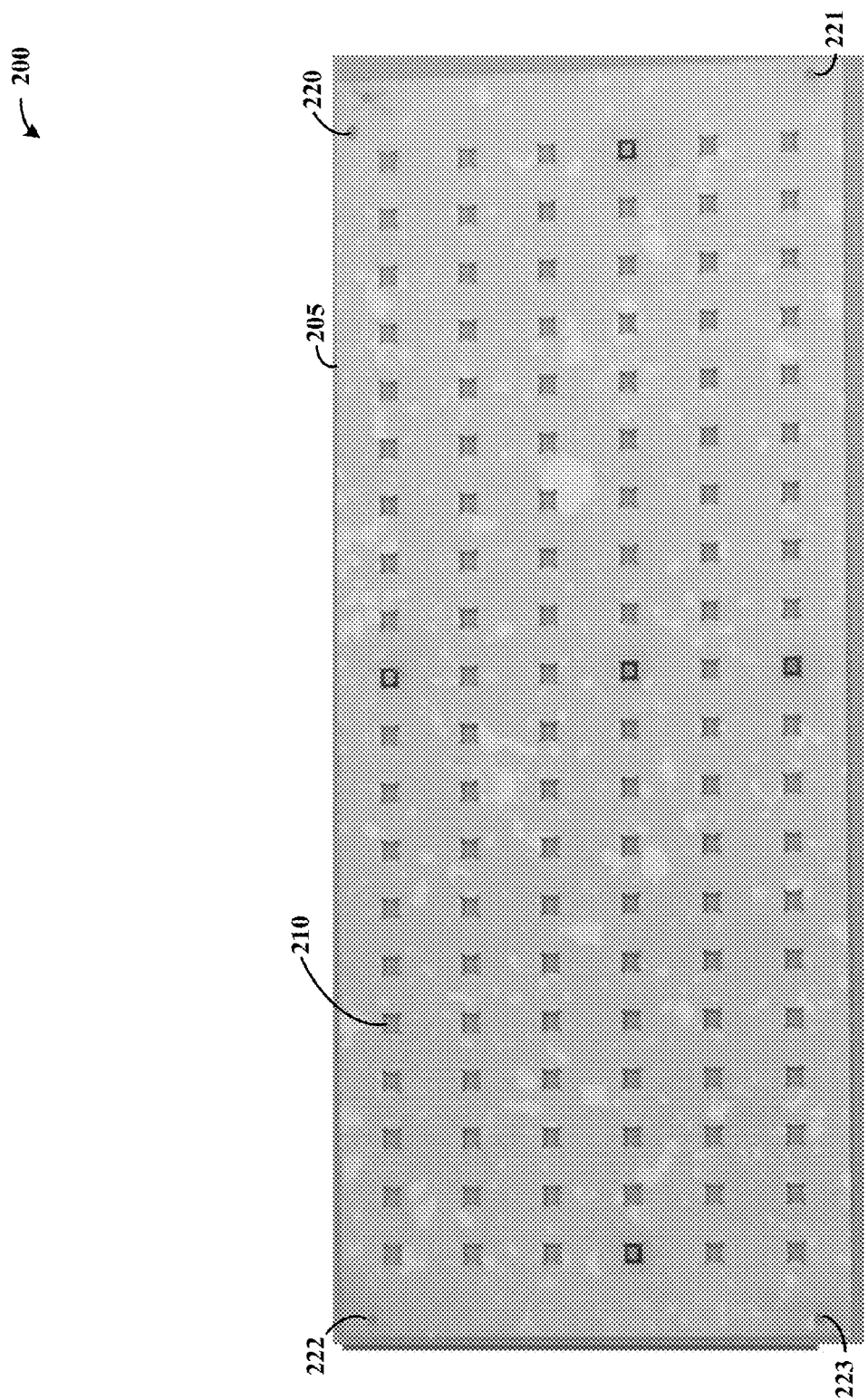
FIG. 2A shows a top view of a chip carrier, in accordance with one or more embodiments.

FIG. 2A shows at top view of a chip carrier apparatus 200, in accordance with one or more embodiments. The chip carrier apparatus 200 is a rigid structure with IC chip openings therein. Opening 210 is labeled by way of example. The chip carrier apparatus 200 can be implemented with a variety of alignment features, including small holes or protrusions at 220, 221, 222 and 223, which may be used to interface with a platform. The chip carrier apparatus can be implemented in a "strip" form as shown, with a substrate 205 being machined to provide the openings and alignment features.

Figure 2B:
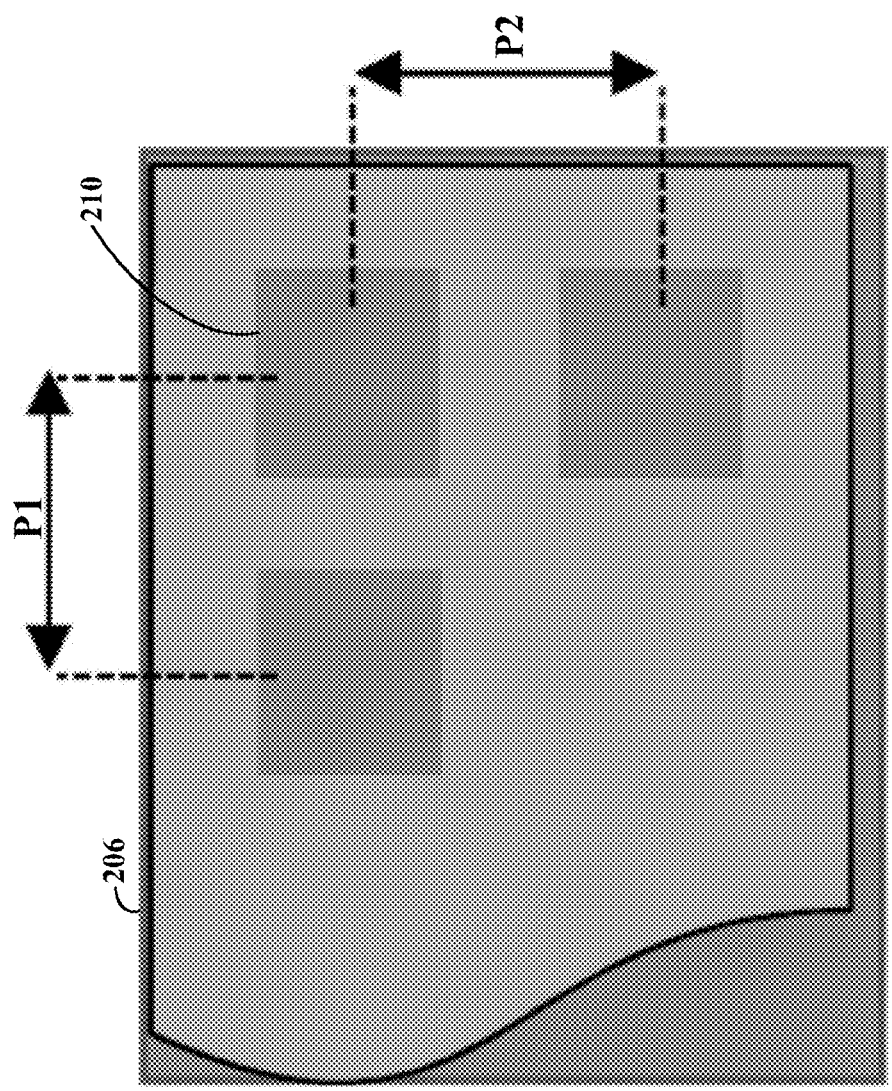
FIG. 2B shows a portion of a chip carrier, as may be implemented with the carrier in FIG. 2A, in accordance with one or more embodiments.

FIG. 2B shows a portion 206 of a chip carrier, as may be implemented with the chip carrier 205 in FIG. 2A, in accordance with one or more embodiments. An opening 210 is spaced from other openings at respective pitches P1 and P2, which can be set to provide ease of access and implemented with test probes to determine relative positioning of chip contacts therein.

Figure 3:
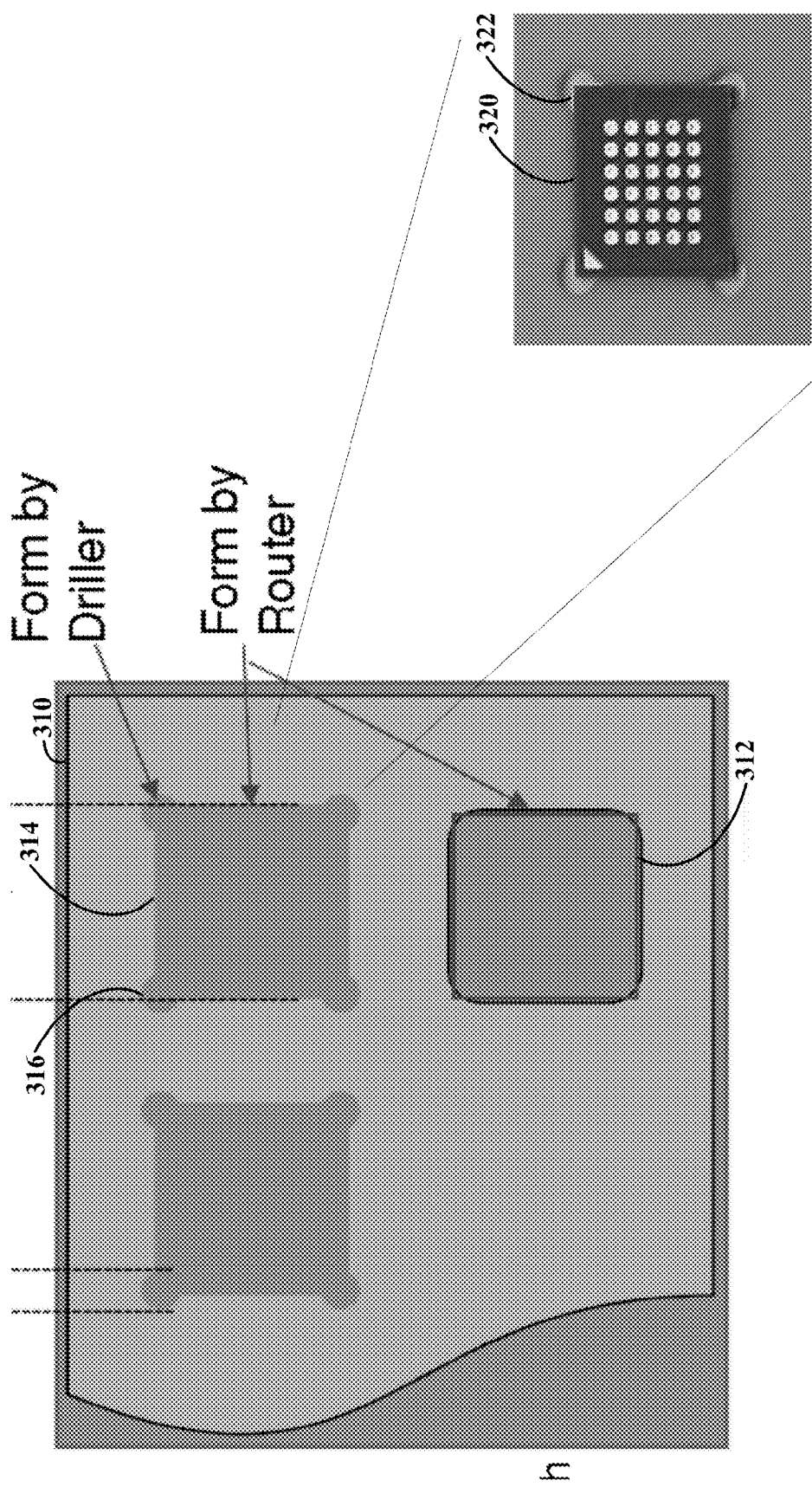
FIG. 3 shows a chip carrier with related implementation and manufacturing aspects, as may be implemented in accordance with one or more embodiments.

FIG. 3 shows a portion 310 of a chip carrier, such as chip carrier 205 of FIG. 2A, with related implementation and manufacturing aspects, as may be implemented in accordance with one or more embodiments. Openings are formed, such as by a router as indicated, to form sidewalls for square or rectangular IC chips as depicted at 314. As shown at 312, a router can be used to make a square-shaped opening. A driller or other tool is used to provide reliefs in each corner, with relief 316 labeled by way of example, to protect corners of IC chips being affixed within the chip carrier. The inset shows an IC chip 320 with corners protected by recess 322. The cavity size may be set to suit particular IC chip sizes, such as with a sizing of 3.55×3.10 mm, with reliefs shown having a diameter of 100 micrometers. Various tolerance settings can be used to suit the application, such as a 50 micrometer tolerance as referenced in the figure.

Figure 4:
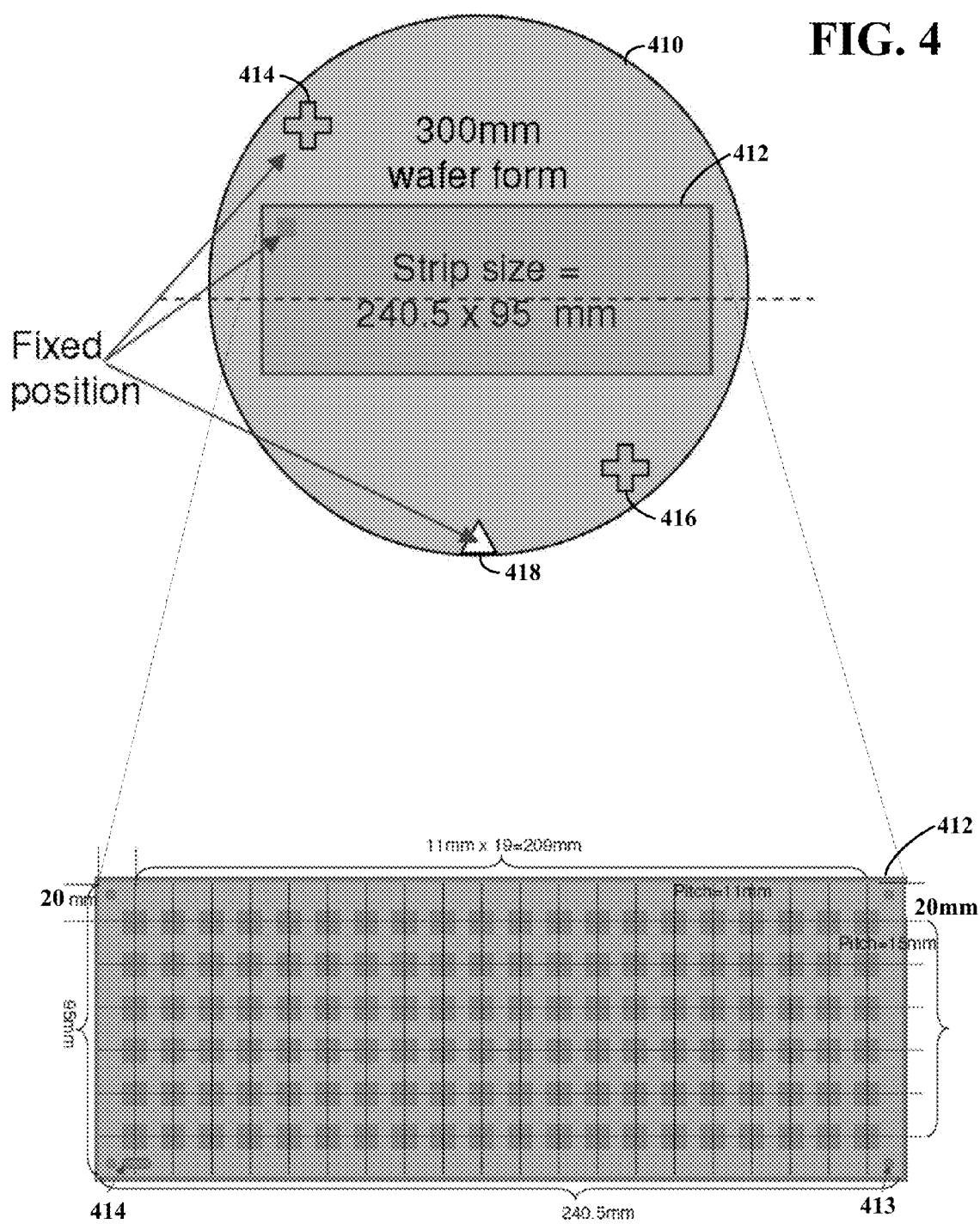
FIG. 4 shows a chip carrier positioned on a test structure, as may be implemented with one or more embodiments.

FIG. 4 shows a chip carrier 412 positioned on a test structure 410, as may be implemented with one or more embodiments. The test structure 410 is shown with alignment features 414, 416 and 418, one or more of which may be used to align a test probe. The inset shows an exemplary chip carrier 412, which may be implemented as a strip with the exemplified sizing. Index holes 413 or an indicator feature 414 can be used for alignment. The chip carrier 412 and openings therein are sized to suit particular applications, with possible sizing shown in the drawings by way of example.

Figure 5:
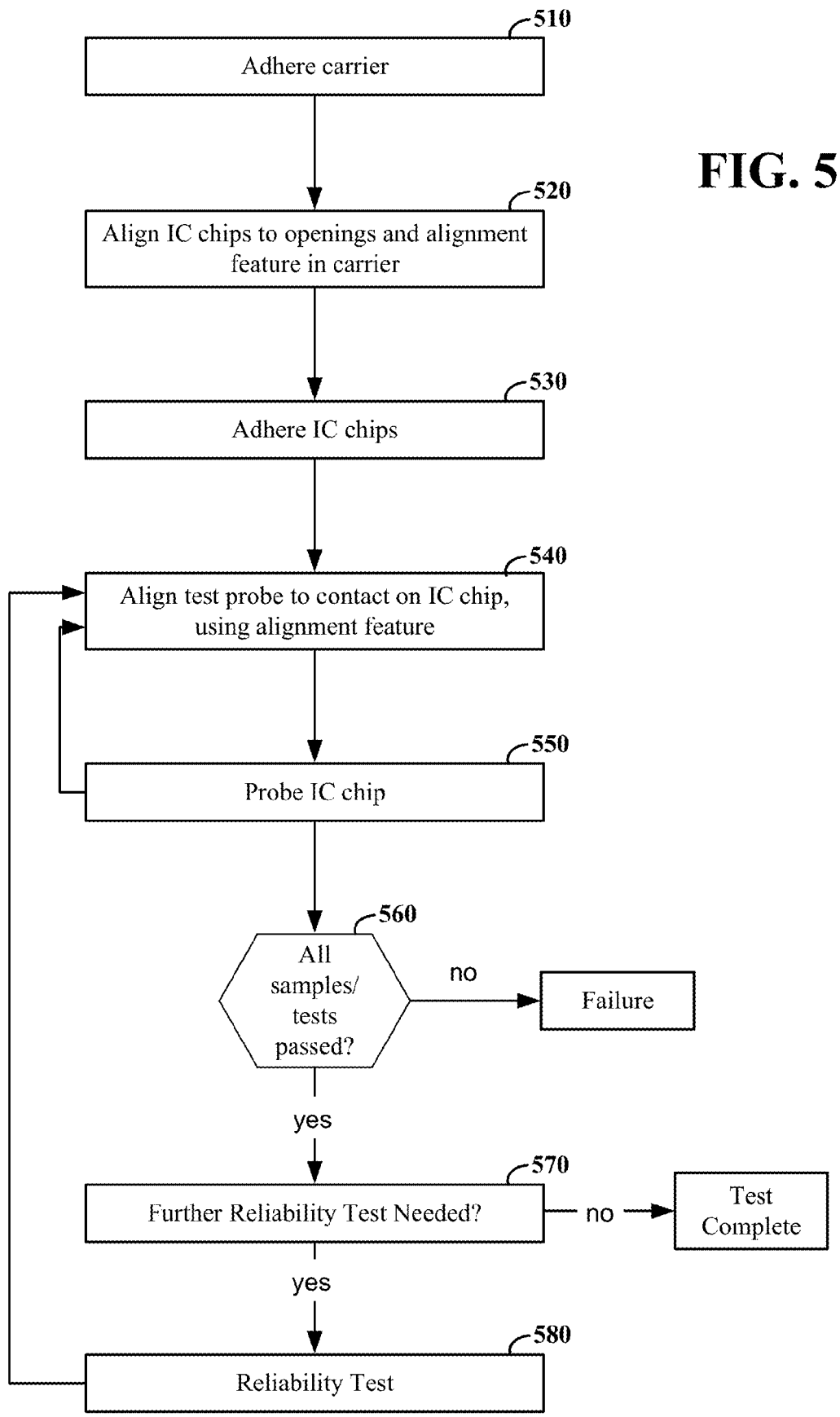
FIG. 5 shows a flow diagram for an approach to testing IC chips, in accordance with one or more embodiments.

FIG. 5 shows a flow diagram for an approach to testing IC chips, in accordance with one or more embodiments. At block 510, an IC chip carrier is adhered to an adhesive substrate such as a tape. At block 520, IC chips are aligned to openings in the chip carrier, and therein to an alignment feature of the chip carrier. At block 530, the IC chips are also adhered, affixing them relative to the chip carrier. One or more of steps at blocks 510, 520 and 530 may be carried out together, such as by adhering the IC chips as they are placed in the openings, or by adhering an adhesive substrate to the carrier and the IC chips at the same time.

At block 540, a test probe is aligned to a contact on one of the IC chips, using the alignment feature of the carrier. The IC chip is then probed, for obtaining signals therefrom. These signals can be used to test/verify operation of the IC chip. These steps at blocks 540 and 550 are repeated, if desired, for additional and/or all IC chips in the carrier. If all samples/tests pass at block 560, the process proceeds to block 570, and otherwise indicates a failure.

At block 570, if reliability testing is desired, a reliability test is performed at block 580 and the IC chips are again tested by returning to the process at block 540. This may involve, for example, subjecting the IC chips and chip carrier to a reliability test at a test station for block 580, and then moving the IC chips with the chip carrier to a test station for testing as begins at block 540. This approach can be iteratively carried out for a variety of reliability tests, until no further testing is required at block 570 (with testing being complete).

Figure 6:
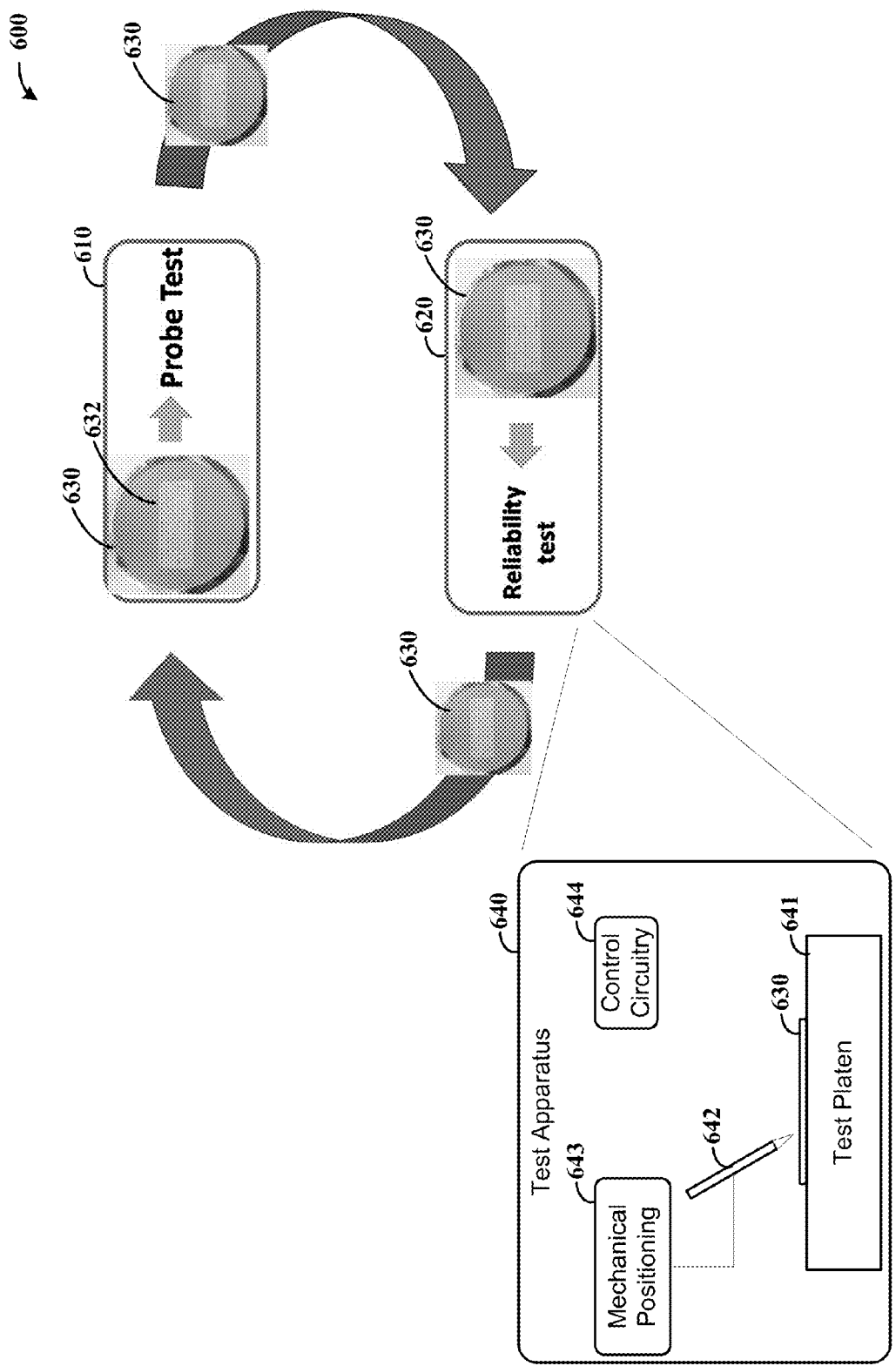
FIG. 6 shows a testing flow diagram, as maybe implemented in accordance with one or more embodiments.

FIG. 6 shows an exemplary testing flow diagram and related apparatus 600, as may be implemented in accordance with one or more embodiments. The apparatus 600 includes a probe/testing station 610 and a reliability testing station 620. A chip carrier 632, such as that shown in FIG. 2A, is provided with IC chips affixed therein and coupled to a test structure 630 (e.g., a wafer-type substrate) that can be moved between test stations. In some instances, a probe test is carried out at 610 after manufacture, after which the IC chips are subjected to reliability testing at station 620. Such testing may involve heat or other conditions, as described herein. The test structure 630 is then returned to the probe/testing station 610, where the IC chips are again aligned relative to a test probe and probed for assessing any response to the reliability testing. This procedure can be iterated for a variety of reliability tests, and with other reliability test stations 620 where desired. The chip carrier 632 facilitates such testing, via composition (e.g., adhesive tape that can withstand high temperatures) and alignment features, in a relatively fast and accurate manner. Further, the IC chips can be tested within the chip carrier under different conditions, without necessarily moving the IC chips relative to the carrier, thus providing protection from damage.

A variety of test apparatuses can be used to suit particular applications. Apparatus 640 exemplifies one such apparatus, with a test platen 641 supporting the test structure 630. A probe 642 is aligned to individual IC chips within a carrier on the test platen 641, with a mechanical positioning component 643. Control circuitry 644 may be implemented to carry out the positioning, based upon alignment features. For instance, optical alignment features on a chip carrier may be detected and used to align the probe. Mechanical alignment features may align the chip carrier (and the IC chips therein) relative to a fixed position of the apparatus 640, which can be used as a reference for moving the probe 642 and contacting chip contacts therewith. In this context, test apparatuses may be implemented in accordance with one or more embodiments, using one or more aspects of a variety of testing apparatuses, such as those provided by Advantest of San Jose, Calif.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., probing, aligning, moving a carrier). For example, in certain of the above-discussed embodiments, one or more modules are discrete logic circuits or programmable logic circuits configured and arranged for implementing these operations/activities, as may be carried out in the approaches shown with FIGS. 5 and 6. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules may include a combination of a CPU hardware-based circuit and a set of instructions in the form of firmware, where the first module includes a first CPU hardware circuit with one set of instructions and the second module includes a second CPU hardware circuit with another set of instructions (e.g., as may be implemented to control manufacturing tools).

Based upon the above discussion and illustrations, those skilled in the art will readily recognize that modifications and changes may be made to the various embodiments without strictly following the exemplary embodiments and applications illustrated and described herein. For example, various sizes and shapes of chip carries may be used to align and hold IC chips for iterative probing and reliability testing. In addition, additional testing apparatuses and chambers can be implemented in this regard, for providing separate testing stations or reliability testing stations (e.g., chambers for heating or applying other atmospheric stress, or applying mechanical stress). Such modifications do not depart from the true spirit and scope of various aspects of the invention, including aspects set forth in the claims.

What is claimed is:

1. A method comprising:
   aligning a plurality of integrated circuit (IC) chips relative to an alignment feature of a chip carrier having a rigid structure with openings therein and adhesive substrate underneath and attached to the rigid structure, wherein portions of the adhesive substrate are exposed in the openings;
   affixing a backside of each of the plurality of IC chips to a respective portion of the adhesive substrate exposed in the openings and relative to the alignment feature, wherein the backside of each of the plurality of IC chips and the rigid structure are attached to a same side of the adhesive substrate;
   subjecting the plurality of IC chips to one or more stress conditions; and
   testing operation of the plurality of IC chips by, for each IC chip:
      coupling a test probe to a contact on the IC chip by aligning the test probe to the contact based on the location of the alignment feature relative to the opening in which the IC chip is located, and
      assessing responsiveness of the IC chip to the one or more stress conditions by probing the IC chip via the aligned test probe, and assessing electrical signals received over the test probe.

2. The method of claim 1, prior to subjecting the plurality of IC chips to the one or more stress conditions, further including for each IC chip,
   coupling the test probe to the contact on the IC chip by aligning the test probe to the contact based on the location of the alignment feature relative to the opening in which the IC chip is located, and assessing operation of the IC chip by probing the IC chip via the aligned test probe, and assessing electrical signals received over the test probe.

3. The method of claim 2, wherein the steps of coupling the test probe include coupling the test probe respectively before subjecting the plurality of IC chips to the one or more stress conditions to carry out a final test after the plurality of IC chips have been manufactured, and reliability testing the plurality of IC chips after subjecting the plurality of IC chips to the one or more stress conditions, while the plurality of IC chips are affixed in the openings, therein assessing operation of the IC chips before and after subjecting the IC chips to the one or more stress conditions.

4. The method of claim 1, wherein the adhesive substrate comprises an adhesive tape.

5. The method of claim 1, wherein the chip carrier and the IC chips are about equal in thickness, and wherein the adhesive substrate has a thickness of no more than about half the thickness of the chip carrier.

6. The method of claim 1, further comprising: adhering the chip carrier to the adhesive substrate.

7. The method of claim 1, further including
forming the plurality of IC chips in a semiconductor wafer;
separating the plurality of IC chips along saw lanes in the semiconductor wafer and between adjacent ones of the plurality of IC chips while holding the plurality of IC chips in place relative to one another; and
encapsulating the plurality of IC chips, therein forming a wafer level chip scale package (WLCSP) for the plurality of IC chips, wherein affixing the plurality of IC chips in the openings includes affixing each WLCSP in one of the openings.

8. The method of claim 1, wherein each of the openings has an inner perimeter that aligns with an outer perimeter of one of the plurality of IC chips, and wherein the aligning includes using the inner perimeter of the openings to align the IC chips within the openings.

9. The method of claim 8, wherein the aligning includes placing each of the plurality of IC chips within one of the openings with a gap between the inner and outer perimeter, the gap being sufficiently small to facilitate the coupling of the test probe to the contact on the chip based on the location of the alignment feature.

10. The method of claim 1, wherein subjecting the plurality of IC chips to one or more stress conditions includes heating the IC chips, chip carrier and adhesive substrate to a temperature of at least 200° C.

11. The method of claim 1, further including coupling the alignment feature to a test platform, therein fixing the chip carrier and plurality of IC chips relative to the test platform and the test probe.

12. The method of claim 1, wherein
the alignment feature is a mechanical component configured and arranged to mechanically couple to a test platform, and
testing the operation of the plurality of IC chips includes using the mechanical component to mechanically secure the chip carrier to the test platform and hold the plurality of IC chips in place for access by the test probe.

13. The method of claim 1, wherein testing the operation of the plurality of IC chips includes mounting the chip carrier, with the plurality of IC chips affixed in the openings, on a test apparatus having a recess therein, and using the recess to hold the chip carrier in place while coupling the test probe.

14. The method of claim 1, further including mitigating damage to the plurality of IC chips by cutting the openings therein with a rectangular shape and a relief in at least one corner of the rectangular shape.

15. An apparatus comprising:
a chip carrier adhered to an adhesive tape, the chip carrier having a rigid structure with openings therein and adhesive tape underneath and attached to the rigid structure, with portions of the adhesive tape exposed in the openings, and having an alignment feature in the rigid structure, the chip carrier and the adhesive tape being configured and arranged to:
align a plurality of integrated circuit (IC) chips relative to the alignment feature via the openings of the chip carrier,
adhere the plurality of IC chips to a respective portion of the adhesive tape exposed in the openings, therein affixing the plurality of IC chips in the openings and relative to the alignment feature, wherein the plurality of IC chips and the rigid structure are attached to a same side of the adhesive tape, and
hold the plurality of IC chips in the openings while the plurality of IC chips are subjected to one or more stress conditions; and
testing circuitry including a test probe, the testing circuitry being configured and arranged with the chip carrier to test the operation of the plurality of IC chips by, for each IC chip,
couple the test probe to a contact on the IC chip by aligning the test probe to the contact based on the location of the alignment feature relative to the opening in which the IC chip is located, and
assess responsiveness of the IC chip to the one or more stress conditions by probing the IC chip via the aligned test probe, and assessing electrical signals received over the test probe.

16. The apparatus of claim 15, wherein each of the openings has an inner perimeter that aligns with an outer perimeter of one of the plurality of IC chips and with a gap therebetween, the inner perimeter being configured and arranged to align the IC chips within the openings and the gap being sufficiently small to facilitate the coupling of the test probe to the contact on the chip based on the location of the alignment feature.

17. The apparatus of claim 15,
further including a test platform;
wherein the alignment feature is a mechanical component; and
wherein the testing circuitry is configured and arranged with the test platform to test the operation of each of the plurality of chips by using the mechanical component to mechanically secure the chip carrier to the test platform and hold the plurality of IC chips in place for access by the test probe.

18. The apparatus of claim 15,
further including a test platform;
wherein the test platform includes a recess, the recess having an inner perimeter configured and arranged with an outer perimeter of the chip carrier to hold the chip carrier in place and in a fixed orientation, and
the testing circuitry is configured and arranged to align the test probe to the contact on each chip based on a location of the recess.

19. The apparatus of claim 15, wherein the testing circuitry is configured and arranged with the chip carrier to, prior to the plurality of IC chips being subjected to the one or more stress conditions, for each IC chip, couple the test probe to the contact on the IC chip by aligning the test probe to the contact based on the location of the alignment feature relative to the opening in which the IC chip is located, and assess operation of the IC chip by probing the IC chip via the aligned test probe, and assessing electrical signals received over the test probe, therein providing an assessment of operation of the plurality of IC chips before and after subjecting the plurality of IC chips to the one or more stress conditions.

20. The apparatus of claim 15, wherein the openings in the chip carrier include an inner perimeter having a rectangular shape with a relief in at least one corner thereof, the relief being configured and arranged to mitigate damage to corners of an IC chip placed within the inner perimeter.

* * * * *